(12) United States Patent
Kim et al.

(10) Patent No.: US 11,327,395 B2
(45) Date of Patent: May 10, 2022

(54) SEMICONDUCTOR DEVICE

(71) Applicant: SAMSUNG ELECTRONICS CO., LTD., Suwon-si (KR)

(72) Inventors: Jae-hee Kim, Yongin-si (KR); Chan Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 16/815,219

(22) Filed: Mar. 11, 2020

(65) Prior Publication Data

US 2020/0209733 A1 Jul. 2, 2020

Related U.S. Application Data

(63) Continuation of application No. 15/865,636, filed on Jan. 9, 2018, now Pat. No. 10,620,528.

(30) Foreign Application Priority Data

May 25, 2017 (KR) .......................... 10-2017-0064892

(51) Int. Cl.
*G03F 1/26* (2012.01)
*G03F 1/36* (2012.01)
(Continued)

(52) U.S. Cl.
CPC .................. *G03F 1/26* (2013.01); *G03F 1/32* (2013.01); *G03F 1/36* (2013.01); *H01L 21/283* (2013.01);
(Continued)

(58) Field of Classification Search
CPC ............... H01L 21/0274; H01L 21/283; H01L 21/31144; H01L 27/10852
See application file for complete search history.

(56) References Cited

U.S. PATENT DOCUMENTS 7,160,651 B2 1/2007 Pinkerton et al.
7,189,495 B2 3/2007 Sheu
(Continued)

FOREIGN PATENT DOCUMENTS

JP 2010-287716 A 12/2010
JP 2011-166071 A 8/2011
(Continued)

OTHER PUBLICATIONS

Korean Notice of Allowance dated Sep. 15, 2021 for corresponding KR Patent Application No. 10-2017-0064892.

*Primary Examiner* — Walter H Swanson
(74) *Attorney, Agent, or Firm* — Lee IP Law, P.C.

(57) ABSTRACT

A method for fabricating a phase shift mask includes preparing a transmissive substrate on which a first mask region and a second mask region surrounding the first mask region are defined. In the first mask region, main patterns are formed having a first pitch in a first direction and a second direction perpendicular to the first direction. Each of the main patterns has a first area. In at least one row, assist patterns are formed at the first pitch to surround the main patterns. Each of the assist patterns has a second area less than the first area. In the second mask region, dummy patterns are formed in a plurality of rows. The dummy patterns surround the assist patterns at the first pitch. Each of the dummy patterns has a third area greater than the first area.

20 Claims, 19 Drawing Sheets

(51) Int. Cl.
*H01L 21/283* (2006.01)
*H01L 21/311* (2006.01)
*H01L 29/41* (2006.01)
*G03F 1/32* (2012.01)
*H01L 27/108* (2006.01)

(52) U.S. Cl.
CPC ........ *H01L 21/31144* (2013.01); *H01L 29/41* (2013.01); *H01L 27/10852* (2013.01)

(56) References Cited

U.S. PATENT DOCUMENTS

| | | |
|---|---|---|
| 7,291,425 B2 | 11/2007 | Dulman |
| 8,111,501 B2 | 2/2012 | Kim |
| 9,377,680 B2 | 6/2016 | Chen et al. |
| 2003/0178728 A1 | 9/2003 | Park et al. |
| 2009/0197385 A1 | 8/2009 | Seo |
| 2010/0314715 A1 | 12/2010 | Fujimoto |
| 2011/0115052 A1 | 5/2011 | Sugioka |
| 2012/0064680 A1 | 3/2012 | Oh et al. |
| 2012/0104559 A1 | 5/2012 | Kim |
| 2012/0235279 A1 | 9/2012 | Seo |
| 2016/0020212 A1 | 1/2016 | Kim et al. |
| 2016/0104618 A1 | 4/2016 | Hong et al. |
| 2016/0141290 A1* | 5/2016 | Kang ............ H01L 21/31 257/532 |

FOREIGN PATENT DOCUMENTS

| | | |
|---|---|---|
| JP | 2015-035619 A | 2/2015 |
| KR | 10-2003-0075907 A | 9/2003 |
| KR | 10-2005-0069449 A | 5/2005 |
| KR | 10-2009-0113613 A | 11/2009 |
| KR | 10-0960471 B1 | 5/2010 |
| KR | 10-2010-0135095 A | 12/2010 |
| KR | 10-2011-0071355 A | 6/2011 |
| KR | 10-2011-0078794 A | 7/2011 |
| KR | 10-2012-0028509 A | 3/2012 |
| KR | 10-2012-0045461 A | 5/2012 |
| KR | 10-2012-0104810 A | 9/2012 |
| KR | 10-2016-0010069 A | 1/2016 |

* cited by examiner

US 11,327,395 B2

SEMICONDUCTOR DEVICE

CROSS-REFERENCE TO RELATED APPLICATIONS

This is a continuation application based on pending application Ser. No. 15/865,636, filed Jan. 9, 2018, the entire contents of which is hereby incorporated by reference.

Korean Patent Application No. 10-2017-0064892, filed on May 25, 2017, and entitled, "Method of Fabricating Phase Shift Mask and Method of Fabricating Semiconductor Device," is incorporated by reference herein in its entirety.

BACKGROUND

1. Field

One or more embodiments described herein relate to a method for fabricating a phase shift mask and a method for fabricating a semiconductor device.

2. Description of the Related Art

Increasing the integration of semiconductor devices continues to be a goal of system designers. According to some approaches, integration may be increased by decreasing the area of unit cells, and specifically the areas occupied by capacitors in the unit cells. However, if the areas of the unit cells or capacitors are decreased too much, the required capacitance of a semiconductor device such as DRAM may not be achieved. Also, the large aspect ratios of lower electrodes in such a device may cause the lower electrodes to collapse or break before a dielectric film is formed.

SUMMARY

In accordance with one or more embodiments, a method for fabricating a phase shift mask includes preparing a transmissive substrate on which a first mask region and a second mask region surrounding the first mask region are defined; and forming, in the first mask region, main patterns having a first pitch in a first direction and a second direction perpendicular to the first direction, each of the main patterns having a first area; forming, in at least one row, assist patterns surrounding the main patterns and having the first pitch, and each of the assist patterns having a second area less than the first area; and forming, in the second mask region, dummy patterns in a plurality of rows, the dummy patterns surrounding the assist patterns and having the first pitch, each of the dummy patterns having a third area greater than the first area.

In accordance with one or more other embodiments, a method for fabricating a semiconductor device includes forming a material layer on a semiconductor substrate on which a cell region and an outer region surrounding the cell region are defined; sequentially forming a mold layer and a support forming layer on the material layer; forming a plurality of holes exposing the material layer by etching the mold layer and the support; forming a plurality of lower electrodes by applying a conductive material onto an inner wall of the plurality of holes; and etching the support forming layer to form a plurality of open regions and forming a support connecting the plurality of lower electrodes using a photolithography process using a phase shift mask, wherein: the phase shift mask includes on a transmissive substrate: main patterns arranged at a first pitch, each of the main patterns having a first area, assist patterns surrounding the main patterns and arranged at the first pitch, each of the assist patterns having a second area less than the first area, and dummy patterns surrounding the assist patterns and arranged at the first pitch, each dummy pattern having a third area greater than the first area.

In accordance with one or more other embodiments, a method for fabricating a semiconductor device, the method comprising: forming, on a semiconductor substrate, lower electrodes in a first direction and a second direction perpendicular to the first direction; and forming a support connecting and supporting the lower electrodes, the support having open regions opening some portions of each of the lower electrodes and having a planar shape with four edges, wherein a first pair of the four edges, facing each other in the first direction, are straight lines and wherein a second pair of the four edges facing each other in the second direction are waveforms.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
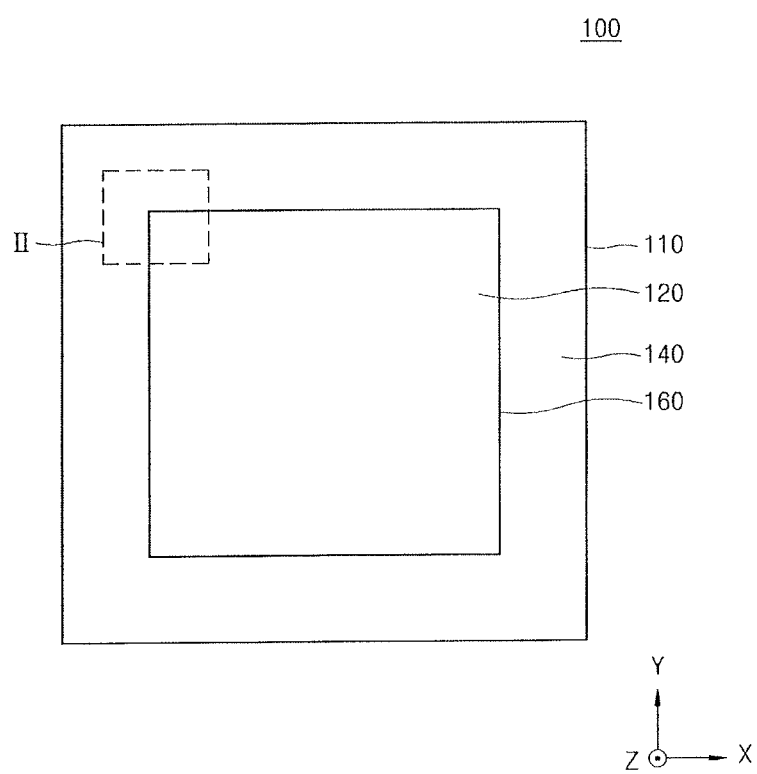
FIG. 1 illustrates layout embodiment of a phase shift mask.

FIG. 1 illustrates a planar layout embodiment of a phase shift mask 100 which may include a transmissive substrate 110. The transmissive substrate 110 may include a first mask region 120 at a center portion, a second mask region 140 surrounding the first mask region 120 and located at an outer portion, and a boundary region 160 between the first mask region 120 and the second mask region 140.

The transmissive substrate 110 may be, for example, a quartz substrate including fusible silica or silicon dioxide ($SiO_2$). A mask pattern may be formed on the transmissive substrate 110. The shape and/or arrangement of the mask pattern may be different in another embodiment.

The mask pattern may include a fine pattern to be formed on a semiconductor substrate, for example, an open region of a support for preventing collapse of a gate, a device isolation film, a via, or a lower electrode. The mask pattern may be formed as a single layer or as a single film. The mask pattern may invert a phase of irradiated light. In one embodiment, the mask pattern may be formed to include a phase shift material. The phase shift material may include, for example, at least one of molybdenum (Mo), silicon (Si), titanium (Ti), tantalum (Ta), nickel (Ni), and aluminum (Al).

The mask pattern may transmit light in a specific wavelength band and block light in one or more other wavelength bands. For example, the mask pattern may transmit light in only the specific wavelength band. In one embodiment, the mask pattern may transmit i-line light and block light in the remaining wavelength bands. Therefore, the mask pattern may have a characteristic of a band pass filter that transmits light only in a specific band.

The demand for a process of forming a fine pattern on a semiconductor substrate has steadily increased. As a result, research and development on a Negative Tone Development (NTD) process using a phase shift mask has been continually conducted.

A technology for forming a mask pattern in a phase shift mask has a close relationship with the accuracy of a fine pattern formed on a semiconductor substrate. For example, when forming a mask pattern, if an optical proximity effect is not properly taken into consideration, distortion may occur in a line width of the fine pattern. As a result, the linearity of the fine pattern may decrease. This may eventually adversely affect the characteristics of a semiconductor device. To solve this problem, according to one embodiment, the phase shift mask 100 allows for optical proximity correction (OPC).

According to one embodiment, a plurality of dummy patterns 104 (e.g., see FIG. 2) may be formed in the phase shift mask 100 to prevent a side lobe problem. Thus, a method may be provided for fabricating a semiconductor device S200 (e.g., see FIG. 10) using the phase shift mask 100. According to this method, the phase shift mask 100 has a mask pattern capable of forming a line width below a limit resolution and may be formed, for example, via a photolithography process including exposure and development processes.

Figure 2:
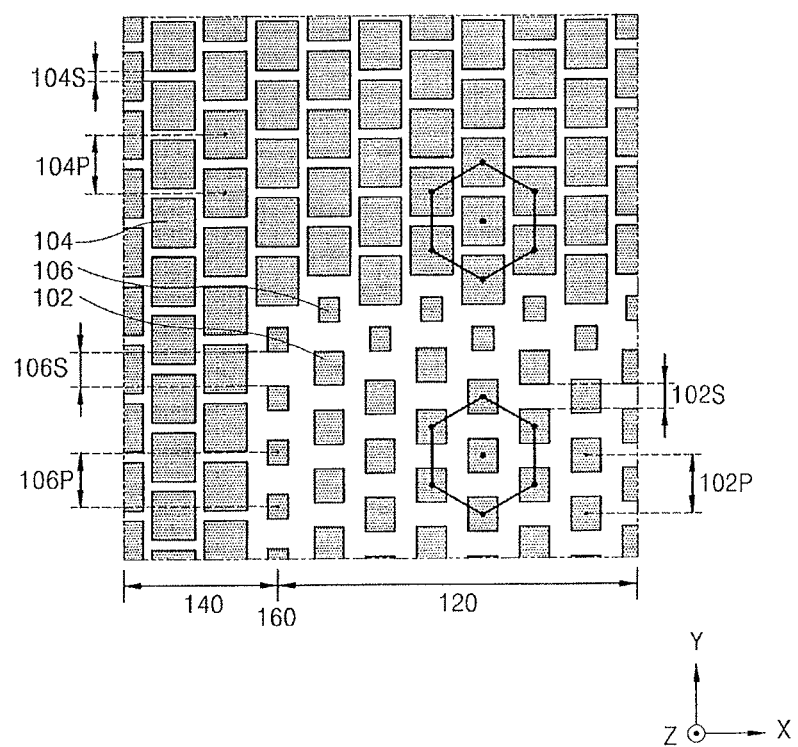
FIG. 2 illustrates an enlarged view of portion II in FIG. 1.

FIG. 2 illustrates an enlarged view of a portion II in FIG. 1, for showing a shape and arrangement of main patterns, assist patterns, and dummy patterns in the phase shift mask according to an embodiment.

Figure 6:
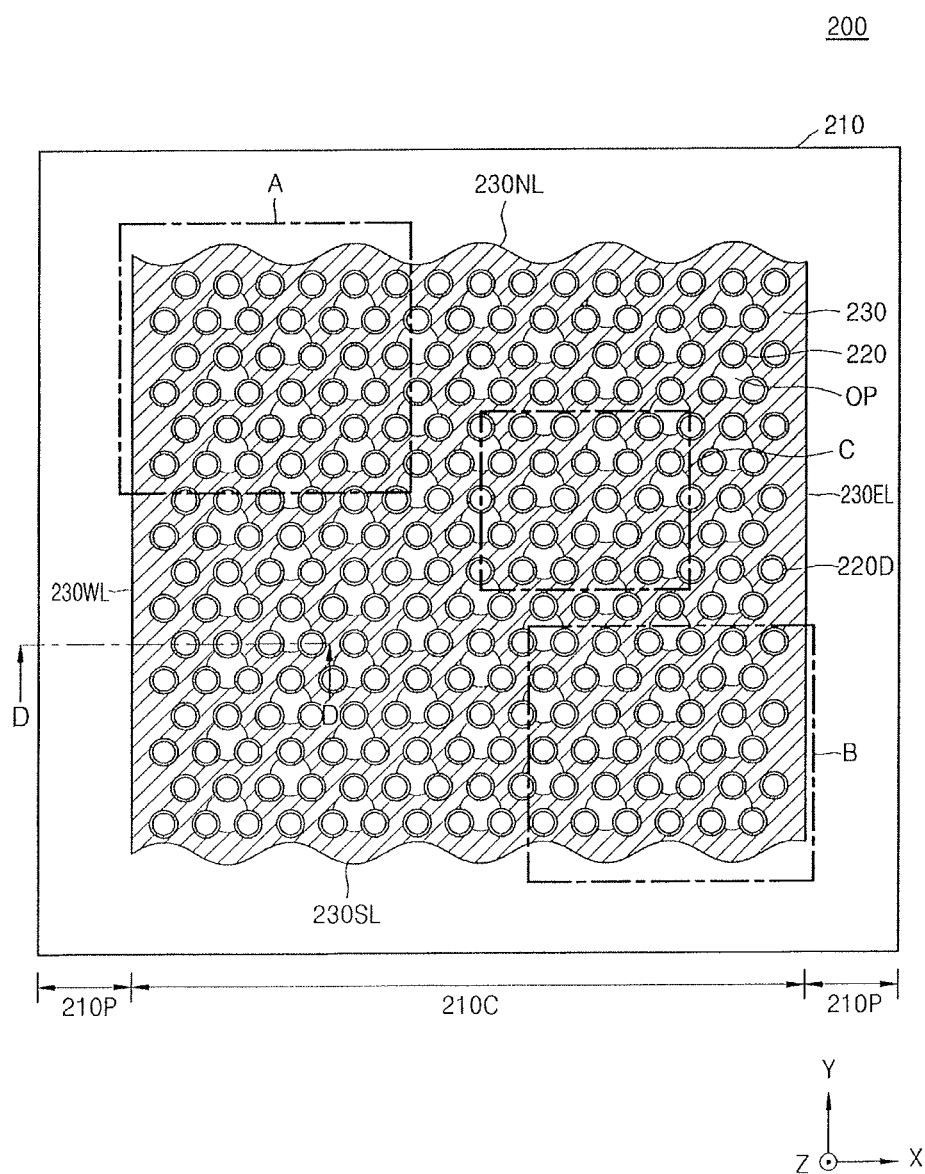
FIG. 6 illustrates an embodiment of a lower electrode, a support, and a substrate of a semiconductor device.

Referring to FIGS. 2 and 6, a plurality of main patterns 102 have a first pitch arranged in a first direction (X direction) and a second direction (Y direction) perpendicular to the first direction (X direction). Each of the main patterns 102 has a first area in the first mask region 120. A plurality of assist patterns 106 surround the plurality of main patterns 102 arranged at the same pitch as the first pitch. Each of the assist patterns 106 having a second area less than the first area in the boundary region 160. A plurality of dummy patterns 104 surround the plurality of assist patterns 106, arranged at the same pitch as the first pitch. Each of the dummy patterns 104 has a third area larger than the first area in the second mask region 140.

The plurality of main patterns 102 and the plurality of dummy patterns 104 may be formed in a honeycomb structure. The plurality of assist patterns 106 may be formed in one row in the boundary region 160, but may be formed in a plurality of rows in one embodiment.

A first spacing 102S between neighboring main patterns 102 is narrower than a second spacing 106S between neighboring assist patterns 106 and wider than a third spacing 104S between neighboring dummy patterns 104. This is because a center distance 102P between neighboring main patterns 102, a center distance 104P between neighboring dummy patterns 104, and a center distance 106P between neighboring assist patterns 106 may be approximately equal to the first pitch.

In addition, each of the plurality of main patterns 102, each of the plurality of dummy patterns 104, and each of the plurality of assist patterns 106 may have a quadrangular shape, and respective transmittances may be substantially equal to one other.

In the case of a semiconductor device 200 including a capacitor having a large aspect ratio (e.g., such as DRAM), a support 230 may prevent a lower electrode 220 constituting the capacitor from collapsing. The support 230 may be formed to include a plurality of open regions OP for smoothly performing a subsequent process.

However, as described above, when forming a fine pattern on a semiconductor substrate 210 using the phase shift mask 100 (which includes a mask pattern for obtaining a line width equal to or less than a limit resolution), there are several difficulties in forming the plurality of open regions OP highly dense and uniform.

First, poor distribution may occur in an open region near an edge of the cell region 210C. The support 230 may have an eave around the edge of the cell region 210C and all of an outer cell region 210P may be removed. It may be difficult to uniformly form the assist patterns 106 in a region corresponding to the eave of the phase shift mask 100. Thus, optical proximity correction may not smoothly be performed. Accordingly, uniform formation of the open region OP may be difficult. In addition, poor distribution of the open region OP may cause a failure of a capacitor, which may ultimately lead to failure of the semiconductor device 200.

Second, a side lobe may occur in the outer cell region 210P when using a high transmittance phase shift mask (PSM) for photolithography. The high transmittance phase shift mask (which may be used for improving optical characteristics by maximizing the difference in the intensity profile of the irradiated light) may be used to make a fine pattern on the semiconductor device 200. When the high transmittance phase shift mask is used to form the plurality of open regions OP in the support 230, the poor distribution of the open region OP may be improved.

However, the outer cell region 210P of the support 230 may have to be entirely removed from the semiconductor substrate 21. To this end, a high transmittance phase shift mask corresponding to the outer cell region 210P may be closed. Therefore, taking into account the characteristics of the high transmittance phase shift mask, the side lobe may occur due to a partial transmission of irradiated light to the closed region.

Third, a process technology may have to be used to determine whether all of lower electrodes 220 (except for dummy lower electrodes 220D) distributed in the cell region 210C are opened by the open regions OP formed on the support 230. If some process technologies are used, it may be very difficult to open all of the lower electrodes 220 (except for the dummy lower electrodes 220D) due to the poor distribution of the open region OP formed near the edge of the cell region 210C.

In order to solve the aforementioned problems, the plurality of main patterns 102, the plurality of dummy patterns 104, and the plurality of assist patterns 106 are formed as described in the phase shift mask 100 of one or more embodiments.

For example, in the phase shift mask 100 according to one or more embodiments, a mask pattern may have three regions including the plurality of main patterns 102, the plurality of dummy patterns 104, and the plurality of assist patterns 106. All of the patterns are repeatedly formed to have the identical first pitch therebetween in the first mask region 120 and the second mask region 140. Thus, optical characteristics of the phase shift mask 100 may be improved. Also, an area where the plurality of dummy patterns 104 are formed in the second mask region 140 may be sufficiently large while the plurality of dummy pattern 104 are separated from each other, so that a photoresist covering the outer cell region 210P may be entirely removed in a process of fabricating the semiconductor device 200.

Figure 3:
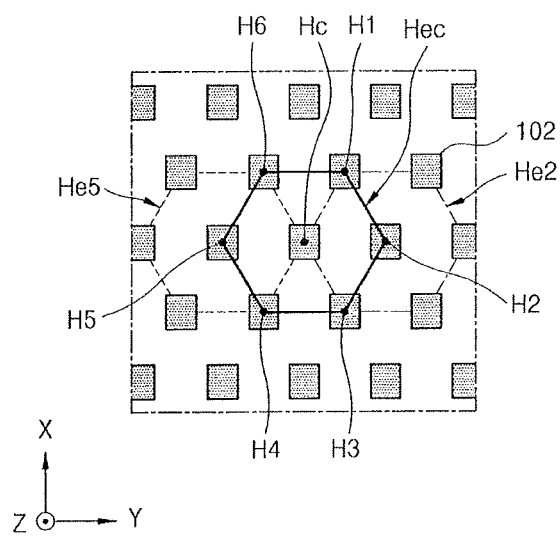
FIG. 3 illustrates an embodiment of a honeycomb structure of a phase shift mask.

FIG. 3 illustrates an embodiment of a honeycomb structure of a main pattern of the phase shift mask. Referring to FIG. 3, each of the plurality of main patterns 102 and the plurality of dummy patterns 104 (e.g., see FIG. 2) of the phase shift mask 100 (e.g., see FIG. 1) may be arranged in a honeycomb structure. For convenience of explanation, only the honeycomb structure of the plurality of main patterns 102 will be described.

The honeycomb structure may have a structure in which the plurality of main patterns 102 are arranged as vertices H1, H2, H3, H4, H5, and H6 and a center point Hc of a hexagon. As illustrated, the plurality of main patterns 102 may form a structure in which a honeycomb structures are successively stacked in a first direction (X direction) and a second direction (Y direction).

For example, first to six vertices H1, H2, H3, H4, H5, and H6 of a center hexagon Hec (shown by a solid line) are respectively center points of first to six neighboring hexagons. The plurality of main patterns 102 may be disposed in a structure in which the center point Hc of the center hexagon Hec is shared by the first to six neighboring hexagons. For example, the second vertex H2 is a center point of the second hexagon He2 (shown in long and short dash lines), the fifth vertex H5 is a center point of the fifth hexagon He5 (shown in dotted lines), and the center point Hc of the center hexagon Hec may be shared as one of six vertices of the second hexagon He2 and the fifth hexagon He5.

In the honeycomb structure of the plurality of main patterns 102, a hexagon may be a regular hexagon. In one embodiment, six triangles which share the center point Hc may all be regular triangles. Thus, within a hexagon, distances between neighboring vertices and a distance between a vertex and a center point may be the same.

As described above, the plurality of main patterns 102 are arranged in a honeycomb structure. Thus, the plurality of main patterns 102 are arranged at a constant interval. In this regard, when the plurality of main patterns 102 are embodied as the plurality of open regions OP on the semiconductor substrate 210 (e.g., see FIG. 6), the plurality of open regions OP may be disposed in an identical structure.

Figure 4:
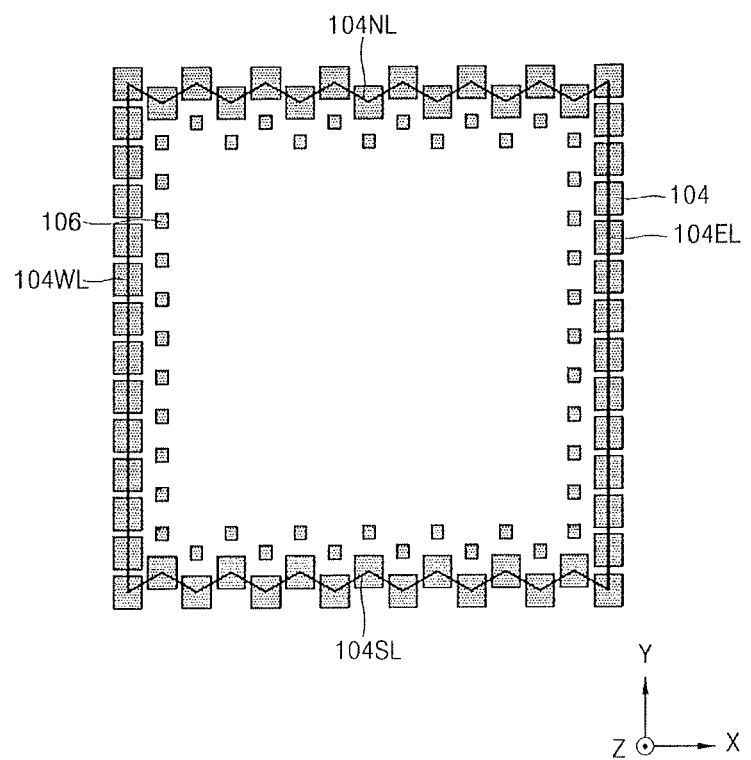
FIG. 4 illustrates an embodiment of boundary lines connecting centers of dummy patterns adjacent to assist patterns of a phase shift mask.

FIG. 4 illustrates an embodiment of boundary lines connecting centers of dummy patterns adjacent to assist patterns of the phase shift mask. Referring to FIG. 4, four boundary lines 104EL, 104WL, 104SL, and 104NL are virtually formed by connecting the centers of the dummy patterns 104 adjacent to the plurality of assist patterns 106 (e.g., see FIG. 2), from among the plurality of dummy patterns 104.

From among the four boundary lines 104EL, 104WL, 104SL, and 104NL), two boundary lines 104EL and 104WL facing each other in the first direction (X direction) may be straight lines, and two boundary lines 104SL and 104NL facing each other in the second direction (Y direction) may be waveforms.

Thus, sufficient space for the plurality of assist patterns 106 to be formed may be secured. Also, the plurality of dummy patterns 104 are arranged in the same honeycomb structure as the plurality of main patterns 102 (e.g., see FIG. 2), so that the two boundary lines 104SL and 104NL facing each other in the second direction (Y direction) may have waveforms. (In accordance with at least one embodiment, a waveform may indicate that a specific form is periodically repeated. A waveform may include various shapes including but not limited to a triangle wave, a sine wave, a saw-tooth wave, a square wave, or a combination thereof.)

The four boundary lines 104EL, 104WL, 104SL, and 104NL may be embodied to respectively correspond to edges 230EL, 230WL, 230SL, and 230NL of the support 230 in the semiconductor device 200 (e.g., see FIG. 6).

Figure 5A:
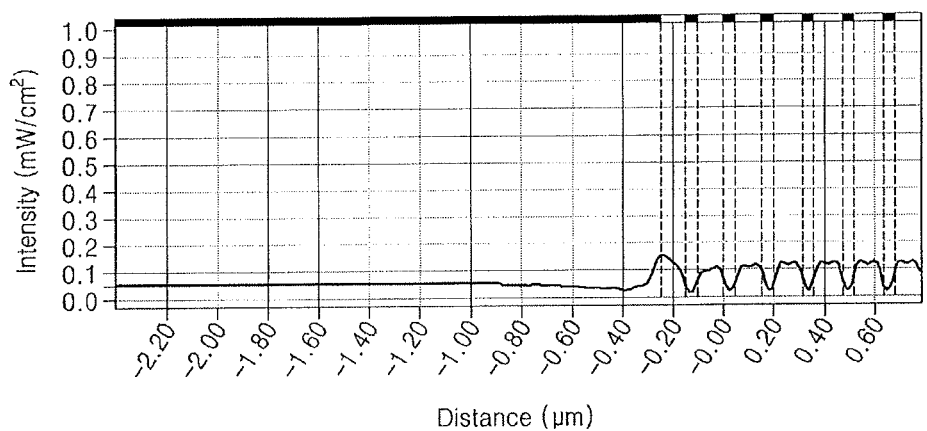
FIGS. 5A and 5B illustrate a comparative example and an embodiment of the intensity of irradiated light transmitted based on the pattern shape of a phase shift mask.
Figure 5B:
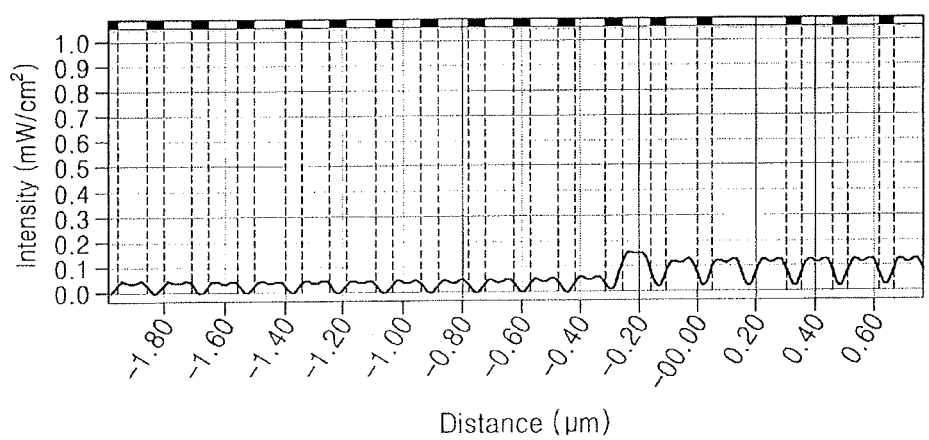

FIG. 5A illustrate an intensity profile of irradiated light transmitted according to a pattern shape of a phase shift mask according to a comparative example, and FIG. 5B illustrates an embodiment of an intensity profile of irradiated light transmitted according to a pattern shape of a phase shift mask according to an embodiment.

Referring to the comparative example of FIG. 5A, simulation results are shown regarding a side lobe problem occurring in the outer cell region 210P (e.g., see FIG. 6). When a plurality of dummy patterns are not formed in a second mask region (where a distance is equal to or less than 0 μm) of the phase shift mask 100 (e.g., see FIG. 1) and the second mask region is closed, the intensity of the irradiated light increases to a certain value depending on the distance. That is, the intensity of the irradiated light increases to more than a reference value (0.05 mW/cm$^2$) in some portions of the second mask region (where a distance is equal to or less than −1.00 μm). Thus, a side lobe problem may occur.

Referring to the embodiment of FIG. 5B, a simulation result is shown about a side lobe problem occurring in the outer cell region 210P (e.g., see FIG. 6). As shown in the phase shift mask 100 (e.g., see FIG. 1) of the embodiment, when the plurality of dummy patterns 104 (e.g., see FIG. 2) are formed in the second mask region (where a distance is equal to or less than 0 μm) and some portions of the second mask region are not closed, the intensity of the irradiated light is maintained at a constant cycle. For example, the intensity of the irradiated light is maintained below a reference value (0.05 mW/cm$^2$) in the second mask region. Thus, a side lobe problem may not occur.

FIG. 6 illustrates an embodiment of a plan view of a lower electrode, a support, and a semiconductor substrate of a semiconductor device 200.

Referring to FIG. 6, the semiconductor device 200 may include the semiconductor substrate 210 on which a plurality of lower electrodes 220 are arranged in a first direction (X direction) and a second direction (Y direction) perpendicular to the first direction (X direction). Also, plurality of open regions OP connect and support the plurality of lower electrodes 220 and open some portions of each of the plurality of lower electrode 220. The support 230 has four edges 230EL, 230WL, 230SL, and 230NL and has a flat shape. The two edges 230EL and 230WL facing each other in the first direction (X direction) are straight lines. The two edges 230SL and 230NL facing each other in the second direction (Y direction) are waveforms. (For convenience of explanation, a dielectric film 250 (e.g., see FIG. 11I) and an upper electrode 260 (see FIG. 11I) are omitted).

The plurality of lower electrodes 220 may be arranged in a honeycomb structure. Also, the plurality of open regions OP may be arranged in the same honeycomb structure as the plurality of main patterns 102 described with reference to FIG. 3. Each of the plurality of open regions OP may be formed to expose some portions of each of three neighboring lower electrodes 220.

Dummy lower electrodes 220D may be arranged asymmetrically near the two edges 230EL and 230WL facing each other in the first direction (X direction).

A cell region 210C and an outer cell region 210P surrounding the cell region 210C may be defined on the semiconductor substrate 210. A plurality of capacitors including the plurality of lower electrodes 220 may be formed in the cell region 210C. The outer cell region 210P may be referred to as a peripheral circuit region. The peripheral circuit region may not include a capacitor having a large aspect ratio. Thus, the peripheral circuit region may be an erase region ER where the support 230 is completely removed.

A photolithography process using the phase shift mask 100 described in FIG. 1 may be performed in order to form the support 230 including the plurality of open regions OP. A mask pattern formed in the phase shift mask 100 may correspond to the erase region ER in an outer portion of the plurality of open regions OP and the support 230.

Figure 7:
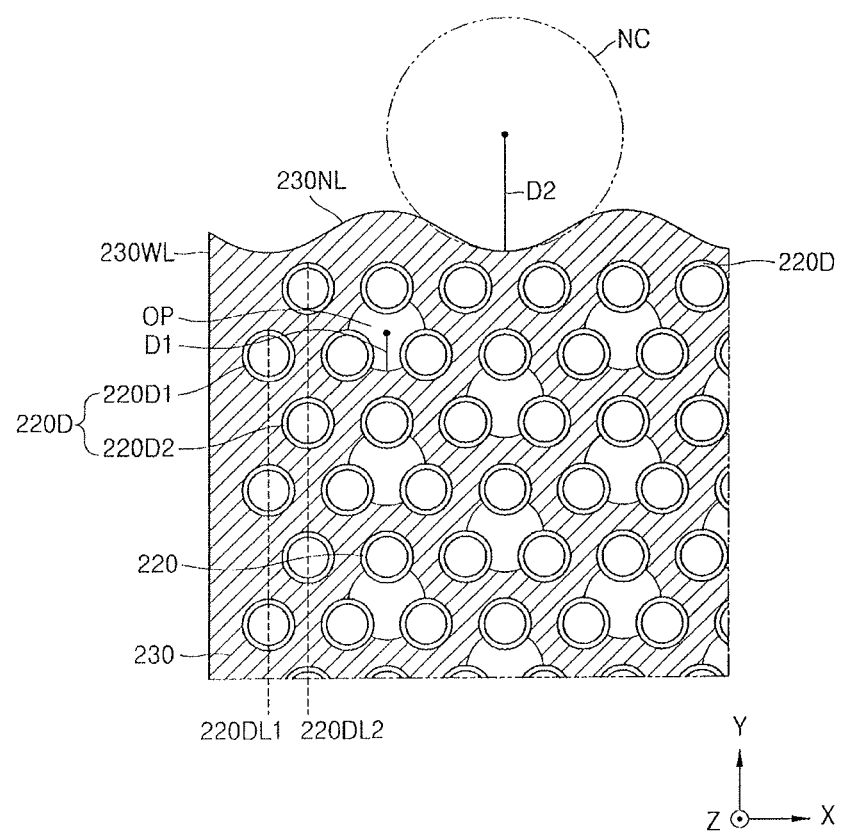
FIG. 7 illustrates an enlarged view of an area A in FIG. 6.

FIG. 7 illustrates an enlarged view of area A in FIG. 6 which includes a lower electrode, an open region, and a support of a semiconductor device according to one embodiment.

Referring to FIG. 7, the support 230 may be formed as an integral body. The dummy lower electrodes 220D may be formed around the edge 230WL. The dummy lower electrodes 220D may be arranged asymmetrically near the two edges 230EL and 230WL (e.g., see FIG. 8) facing each other in the first direction (X direction).

The dummy lower electrodes 220D near the edge 230WL will be described below. As shown in an enlarged view of a final shape of the support 230, the dummy lower electrodes 220D may be arranged asymmetrically near the two edges 230EL and 230WL facing each other in the first direction (X direction), so as to prevent the plurality of lower electrodes 220 from collapsing and improve a poor distribution of the plurality of open regions OP.

As described above, when the dummy lower electrodes 220D are arranged asymmetrically, an area of the support 230 is maintained while improving poor distribution. Some portions aligned along the second direction (Y direction) from among the plurality of open regions OP are removed. Thus, a spatial margin for the edge 230WL of the support 230 may be secured without opening the dummy lower electrodes 220D. Even when a certain number of the dummy lower electrodes 220D is used, characteristics of a semiconductor device may not be affected.

In one embodiment, the edge 230WL may include two lines, e.g., a first dummy lower electrode line 220DL1 and a second dummy lower electrode line 220DL2. The first dummy lower electrode line 220DL1 is a virtual line connecting centers of first dummy lower electrodes 220D1. The second dummy lower electrode line 220DL2 is a virtual line connecting centers of second dummy lower electrodes 220D2.

Each of the plurality of open regions OP may expose some portions of three neighboring lower electrodes 220. The edge 230NL in the second direction (Y direction) may be a waveform, e.g., a specific form is periodically repeated. The waveform may include various shapes including but not limited to a triangle wave, a sine wave, a saw-tooth wave, a square wave, or a combination thereof.

Assuming a virtual circle NC constitutes the waveform, the radius of curvature D2 of the virtual circle NC may be greater than the radius of curvature D1 of the plurality of open region OP. The phase shift mask 100 may therefore have a structure that is based on a difference in areas of the plurality of dummy patterns 104 and the plurality of main patterns 102.

Figure 8:
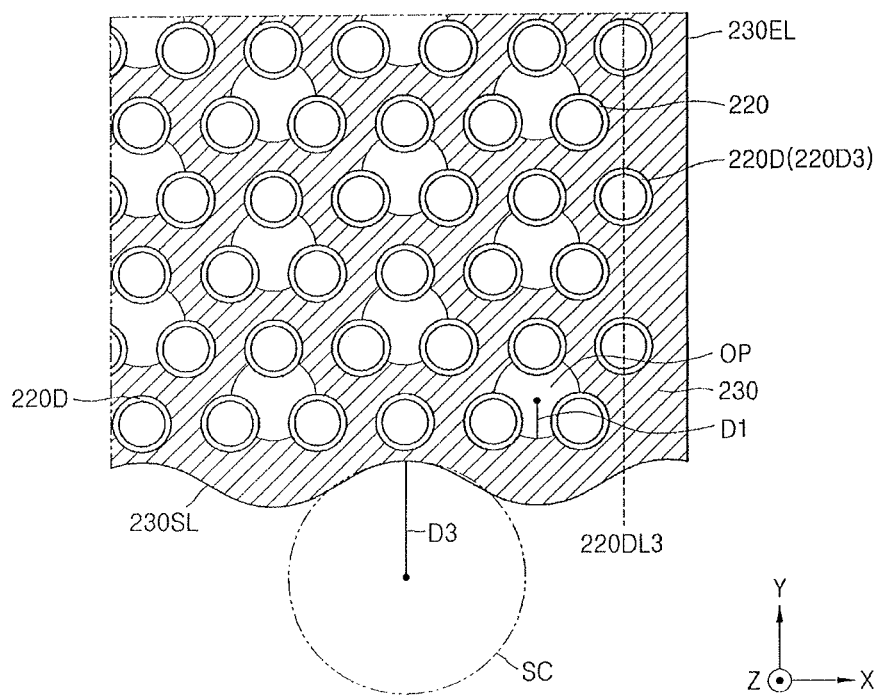
FIG. 8 illustrates an enlarged view of an area B in FIG. 6.

FIG. 8 illustrates an enlarged view of area B in FIG. 6 which includes a lower electrode, an open region, and a support of a semiconductor device according to an embodiment.

Referring to FIG. 8, the support 230 may be formed as an integral body, and the dummy lower electrodes 220D may be formed near the edge 230EL. The dummy lower electrodes 220D may be arranged asymmetrically near the two edges 230EL and 230WL (e.g., see FIG. 7) facing each other in the first direction (X direction).

The dummy lower electrodes 220D neat the edge 239EL will be described. Compared with the edge 230WL (e.g., see FIG. 7) of the support 230, one line consisting of a third dummy lower electrode line 220DL3 may be formed in the edge 230EL. The third dummy lower electrode line 220DL3 is a virtual line connecting centers of third dummy lower electrodes 220D3.

The edge 230SL in the second direction (Y direction) may be a waveform. Assuming a virtual circle SC constitutes the waveform, the radius of curvature D3 of the virtual circle SC may be greater than the radius of curvature D1 of the plurality of open region OP.

Figure 9:
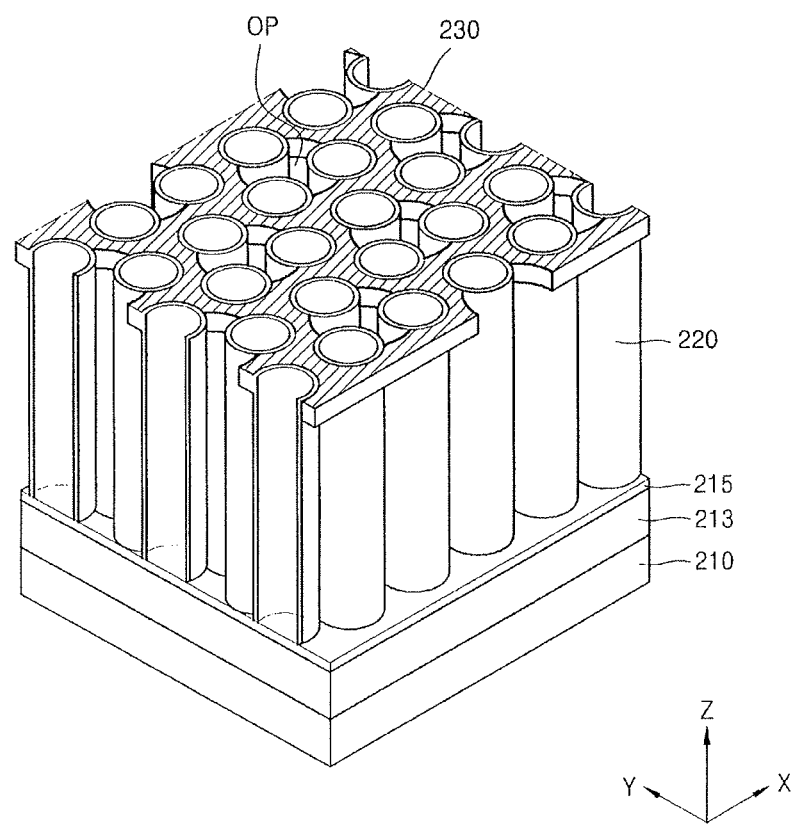
FIG. 9 illustrates an enlarged view of an area C in FIG. 6.

FIG. 9 illustrates an enlarged perspective view of area C in FIG. 6, showing a lower electrode, an open region, and a support of a semiconductor device according to an embodiment.

Referring to FIG. 9, the semiconductor device 200 (e.g., see FIG. 6) may include a charge storage, for example, a capacitor. The capacitor may form a storage electrode, e.g., the lower electrode 220 in a cylindrical structure in order to increase capacitance. In the semiconductor device 200, the lower electrode 220 may be formed in a cylindrical structure as illustrated. In some embodiments, the lower electrode 220 may be formed as a pillar-shaped structure below a cylindrical structure.

The plurality of lower electrodes 220 may be arranged in the first direction (X direction) and the second direction (Y direction) to form a plurality of rows and columns. In order to secure a space between the plurality of lower electrodes 220, lower electrodes 220 of one row may be disposed in a staggered manner with lower electrodes 220 of another neighboring row. For example, Y coordinate values of the lower electrodes 220 of one row and the lower electrodes 220 of another neighboring row may differ. As described above, the plurality of lower electrodes 220 are arranged in a staggered pattern. Thus, a relatively large space may be secured between the plurality of lower electrodes 220. The dielectric film 250 may be uniformly formed in a subsequent process (e.g., see FIG. 11I).

In addition, the plurality of lower electrodes 220 may be disposed at vertices and a center point of a hexagon, to thereby form a honeycomb structure. An aspect ratio the plurality of lower electrodes 220 may be very large. For example, the aspect ratio of the plurality of lower electrodes 220 may be about 10 to about 30. Also, each of the plurality of lower electrodes 220 may have a diameter between about 20 nm to about 100 nm. The plurality of lower electrodes 220 may have a height between about 500 nm to about 4000 nm. The structure, diameter, and/or height of the plurality of lower electrodes 220 may be different in another embodiment.

As described above, as the aspect ratio of the plurality of lower electrodes 220 increases, the plurality of lower electrodes 220 may collapse or break. In this regard, the semiconductor device 200 according to one embodiment may include the support 230 to prevent collapse or breakage of the plurality of lower electrodes 220.

The support 230 may include the plurality of open regions OP arranged according to a predetermined rule. Each of the plurality of open regions OP may be formed to open three neighboring lower electrodes 220.

An open region OP of the support 230 which opens three lower electrodes 220 may correspond to a structure of the support 230 that exists before the dielectric film 250 is formed. After the dielectric film 250 and the upper electrode 260 are formed, the lower electrodes 220 are covered by the dielectric film 250 and the upper electrode 260. Thus, the lower electrodes 220 may not be open by the open region OP. The open region OP be a region that is opened in the support 230 and formed in a flat-shape, e.g., a region that does not contact the support 230 from among the lower electrodes 220. Thus, in at least one embodiment, the open region OP may not correspond to a region opened in the semiconductor device 200.

The support 230 may be formed on side portions of the upper end of the plurality of lower electrodes 220 to support the plurality of lower electrodes 220. Therefore, the support 230 may expose an upper surface of the plurality of lower electrodes 220, as illustrated.

For reference, as the ratio of the opened lower electrodes 220 becomes higher, the subsequent process such as a dielectric film forming process may be performed in a smoother and more uniform manner. Otherwise, as the ratio of the opened lower electrodes 220 becomes lower, the subsequent process may not be performed in a smooth and uniform manner. In other words, if there are many lower electrodes 220 that are not open, formation of a dielectric film or the like on the lower electrode 220 may be incomplete and uneven. Accordingly, performance or reliability of the semiconductor device 200 may be deteriorated.

According to one embodiment, the semiconductor device 200 may include the support 230 having the plurality of open regions OP. Each open region OP may open three lower electrodes 220 in order to support the plurality of lower electrodes 220. The plurality of open regions may be arranged in a uniform distribution. Thus, the support 230 may have a high open ratio. Accordingly, reliability of the semiconductor device 200 may be improved by smoothly performing the subsequent process.

Figure 10:
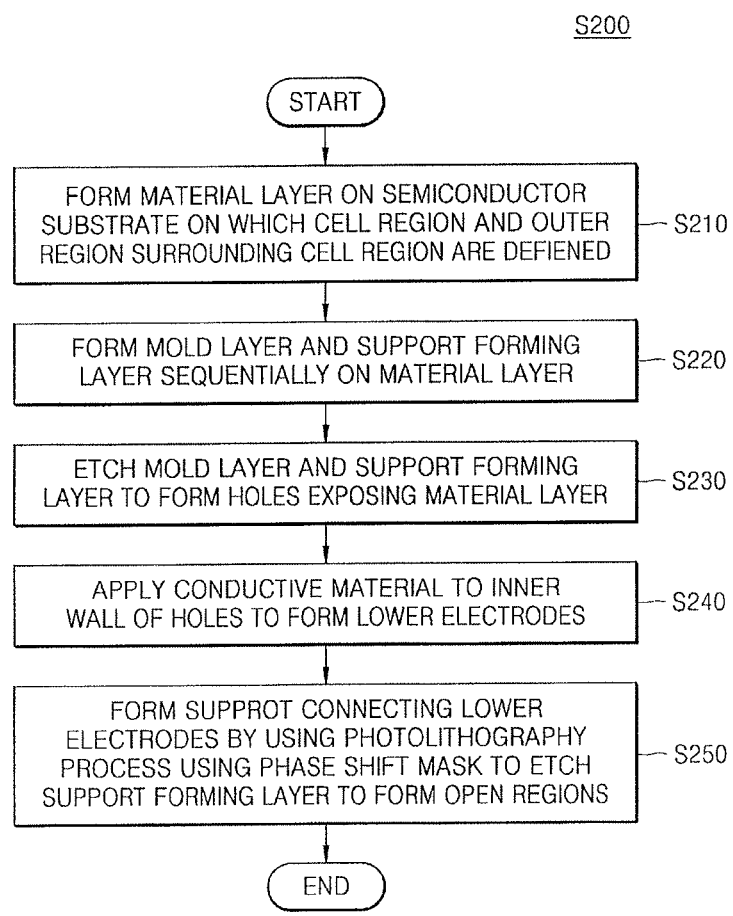
FIG. 10 illustrates an embodiment of a method for fabricating a semiconductor device.

FIG. 10 illustrates an embodiment of a method for fabricating a semiconductor device. Referring to FIG. 10, the method S200 may include the following processes. However, a specific process may be performed differently than indicated below. For example, two successive processes may be performed substantially concurrently or may be performed in the reverse order.

The method includes forming a material layer on a semiconductor substrate on which a cell region and an outer region surrounding the cell region are defined (S210), sequentially forming a mold layer and a support forming layer on the material layer (S220), etching the mold layer and the support forming layer to form a plurality of holes exposing the material layer (S230), and applying a conductive material to an inner wall of the plurality of holes to form a plurality of lower electrodes (S240). In a process S250, a photolithography process is performed using a phase shift mask. In this process, the support forming layer is etched to form a plurality of open regions, to thereby form a support connecting the plurality of lower electrodes.

As described above, the phase shift mask 100 may include, on the transmissive substrate 110 (e.g., see FIG. 1), the plurality of main patterns 102 (e.g., see FIG. 2) formed to have a first pitch and each having a first area, the plurality of assist patterns 106 (e.g., see FIG. 2) surrounding the plurality of main patterns 102, formed to have the first pitch, and each having a second area smaller than the first area, and the plurality of dummy patterns 104 (e.g., see FIG. 2) surrounding the plurality of assist patterns 106, formed to have the first pitch, and each having a third area greater than the first area.

Figure 11A:
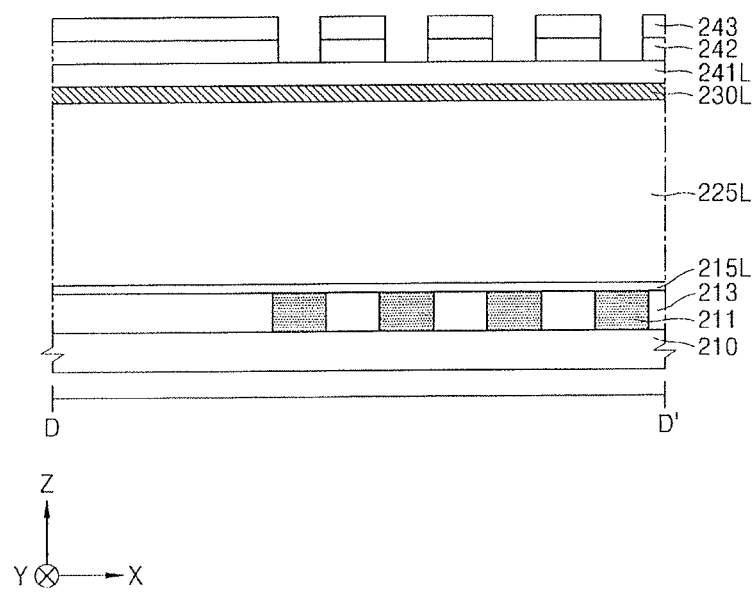
FIGS. 11A to 11I illustrate various stages of an embodiment of a method for fabricating a semiconductor device.

FIGS. 11A to 11I illustrate various stages of an embodiment of a method for fabricating a semiconductor device. Referring to FIG. 11A, a contact plug 211 is formed within an interlayer insulating film 213 on the semiconductor substrate 210. Also, an etching stopper film 215L is formed on upper surfaces of the interlayer insulating film 213 and the contact plug 211 to form a mold layer 225L on an upper surface of the etching stopper film 215L.

In one embodiment, all the films formed below the etching stopper film 215L, including the interlayer insulating film 213 and the contact plug 211, may be collectively referred to as a material layer.

The semiconductor substrate 210 may include a semiconductor such as Si or Ge. In some embodiments, the semiconductor substrate 210 may include a compound semiconductor such as SiGe, SiC, GaAs, InAs, or InP. In some embodiments, the semiconductor substrate 210 may have a silicon on insulator (SOI) structure. The semiconductor substrate 210 may include a conductive region, for example, a well doped with impurities, or a structure doped with impurities. Also, the semiconductor substrate 210 may have various device isolation structures such as a shallow trench isolation (STI) structure.

The mold layer 225L may include a silicon oxide film. For example, the mold layer 225L may include a material such as Boro Phosphorous Silicate Glass (BPSG), Spin On Dielectric (SOD), Phosphorous Silicate Glass (PSG), Low Pressure Tetra Ethyl Ortho Silicate (LPTEOS), or Plasma Enhanced Tetra Ethyl Ortho Silicate (PETEOS). The mold layer 225L may be formed to have a predetermined thickness, e.g. in a range of about 500 nm to about 4000 nm.

Next, a support forming layer 230L is formed on the mold layer 225L. The support forming layer 230L may include a material such as a silicon nitride film or a polysilicon film, which constitutes a structure for preventing collapse of a lower electrode, during a subsequent wet etching process. The support forming layer 230L may be formed to have a predetermined thickness, e.g., in a range of about 20 nm to about 150 nm.

Then, a first sacrificial film 241L is formed on the support forming layer 230L. The first sacrificial film 241L may include a material such as TEOS, BPSG, PSG, Undoped Silicate Glass (USG), SOD, or High Density Plasma (HDP) oxide. The first sacrificial film 241L may be formed to have a predetermined thickness, e.g., in a range of about 50 nm to about 200 nm.

Next, a second sacrificial layer is formed on the first sacrificial film 241L, a first photoresist is applied on the second sacrificial layer, and then the first photoresist is patterned by photolithography process to form a first photoresist pattern 243. The first photoresist pattern 243 may define an open region where a plurality of lower electrodes are to be formed. The second sacrificial layer may include a material such as an oxide film, a silicon nitride film, a silicon oxynitride film, or a polysilicon film. An anti reflective coating (ARC) film may be formed on the second sacrificial layer.

Next, using the first photoresist pattern 243 as an etch mask, the second sacrificial layer is etched to form a second sacrificial pattern 242. When an ARC film is formed on the second sacrificial layer, the ARC film is etched to form an anti reflective pattern.

Figure 11B:
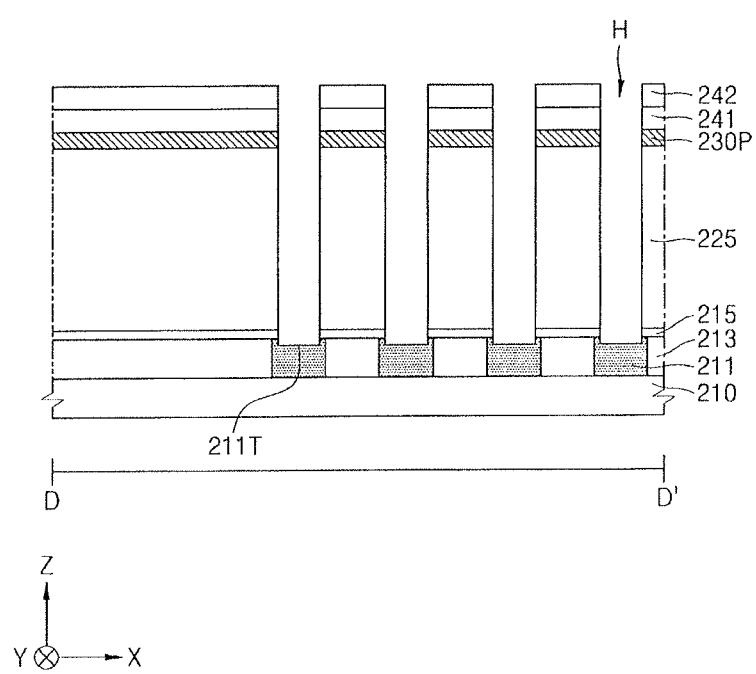

Referring to FIG. 11B, after removing the first photoresist pattern 243, the first sacrificial film 241L, the support forming layer 230L, the mold layer 225L, and etching stopper film 215L (e.g., see FIG. 11A) are sequentially etched by using the second sacrificial pattern 242 as an etch mask.

Thus, a plurality of holes H are formed, and an upper surface of the contact plug 211 may be exposed through the holes H. According to the above etching, the first sacrificial film 241L becomes a first sacrificial pattern 241, the support forming layer 230L becomes a support pattern 230P, the mold layer 225L becomes a mold pattern 225, and the etching stopper film 215L becomes an etching stopper pattern 215.

When the mold layer 225L is dry-etched, the plurality of holes H may have a shape in which a lower line width is less than an upper line width. However, for the convenience of explanation, they are shown in a vertical shape in the drawing. In some embodiments, a groove 211T may be formed in an upper surface of the contact plug 211 by over-etching. In some embodiments, a groove may not be formed on an upper surface of the contact plug 211.

Figure 11C:
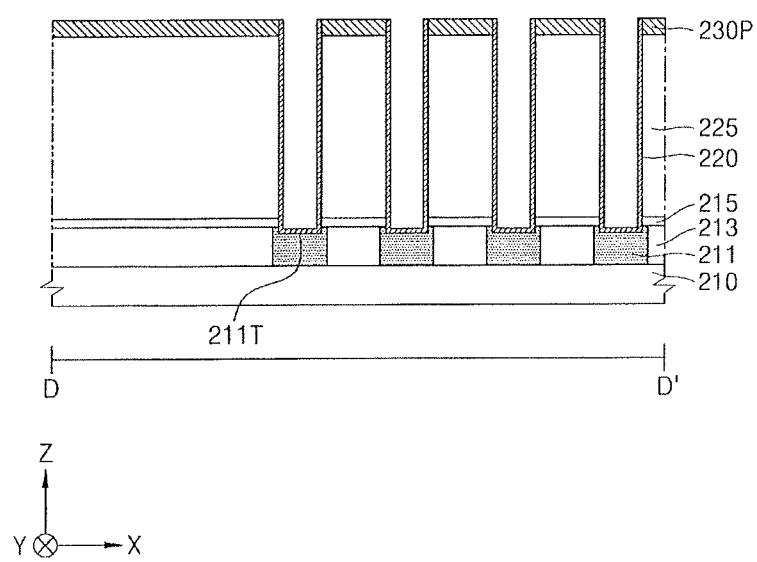

Referring to FIG. 11C, after removing the second sacrificial pattern 242 (e.g., see FIG. 11B), a conductive material to be used as a lower electrode is conformally formed over the surface on which the removal process is performed. Then, a node separation process is performed to form the plurality of lower electrodes 220 along a bottom and side surfaces of the holes H (e.g., see FIG. 11B).

A conductive material corresponding to the plurality of lower electrodes 220 may include, for example, a metal nitride film, a metal film, or a combination thereof. For example, a conductive material may include at least one selected from TiN, Ru, TaN, WN, Pt or Ir. A conductive material may be formed by Chemical Vapor Deposition (CVD) or Atomic Layer Deposition (ALD) and may have a thickness of about 20 nm to about 100 nm In the node separation process, the first sacrificial pattern 241 (e.g., see FIG. 11B) is removed using an etch-back method or chemical mechanical polishing (CMP). The first sacrificial pattern 241 may protect the support pattern 230P during the node separation process.

The plurality of lower electrodes 220 are insulated and separated from each other by the mold pattern 225. If the holes H have a shape in which a lower line width is less than an upper line width, the plurality of lower electrodes 220 may also have the same shape. Thus, the plurality of lower electrodes 220 may have a shape in which a lower line width is less than an upper line width.

A bottom of the lower electrode 220 may firmly contact and be laminated on the groove 211T on an upper surface of the contact plug 211. An upper outer surface of the lower electrode 220 may be fixed and supported by the support pattern 230P.

Figure 11D:
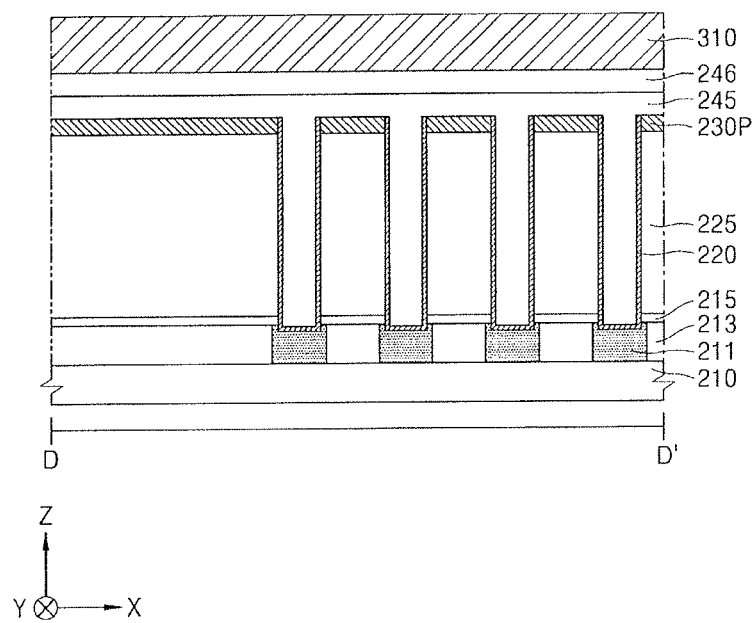

Referring to FIG. 11D, a third sacrificial film 245 is formed over the surfaces of the plurality of lower electrodes 220 and the support pattern 230P. Then, an ARC film 246 is formed on the third sacrificial film 245 to form a second photoresist 310 on the ARC film 246. The third sacrificial film 245 may include, for example, a silicon oxide film such as TEOS, BPSG, PSG, USG, SOD, or HDP.

The ARC film 246 may include, for example, an inorganic ARC film, an organic ARC film, or a combination thereof. The ARC film 246 may absorb or, due to an interference effect, cancel light reflected from a surface or an interface of the third sacrificial film 245 in a photolithography process for forming a second photoresist pattern 310P (e.g., see FIG. 11F). In some embodiments, the ARC film 246 may be omitted.

Figure 11E:
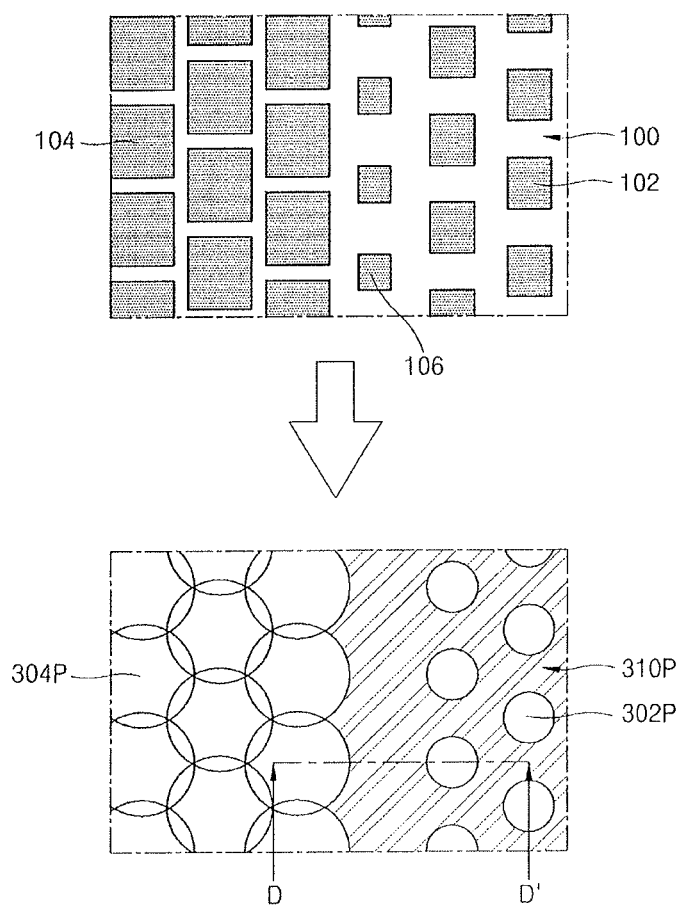

FIG. 11E shows a photolithography process for forming the second photoresist 310 (e.g., see FIG. 11D) as the second photoresist pattern 310P using the phase shift mask 100, which includes the plurality of main patterns 102, the plurality of dummy patterns 104, and the plurality of assist patterns 106. The plurality of main patterns 102, the plurality of dummy patterns 104, and the plurality of assist patterns 106 have an identical first pitch. Thus, optical characteristics may be improved and a uniform distribution of irradiated light may be maintained by optical proximity correction, in which the plurality of assist patterns 106 are not embodied on the second photoresist pattern 310P.

Also, according to an embodiment, in the phase shift mask 100 a mask pattern is configured as three regions including the plurality of main patterns 102, the plurality of dummy patterns 104, and the plurality of assist patterns 106. These patterns are repeatedly formed to have an identical first pitch. Thus, by optical proximity correction in which the plurality of assist patterns 106 are not embodied on the second photoresist pattern 310P, optical characteristics may be improved. At the same time, the size of the plurality of dummy patterns 104 is sufficiently enlarged so that the second photoresist 310 covering the outer cell region 210P may be completely removed in a process of fabricating the semiconductor device 200 (e.g., see FIG. 6). In this case, as already described with reference to FIG. 5B, there may be a space between the plurality of dummy patterns 104 to prevent a side lobe of the outer cell region 210P.

Figure 11F:
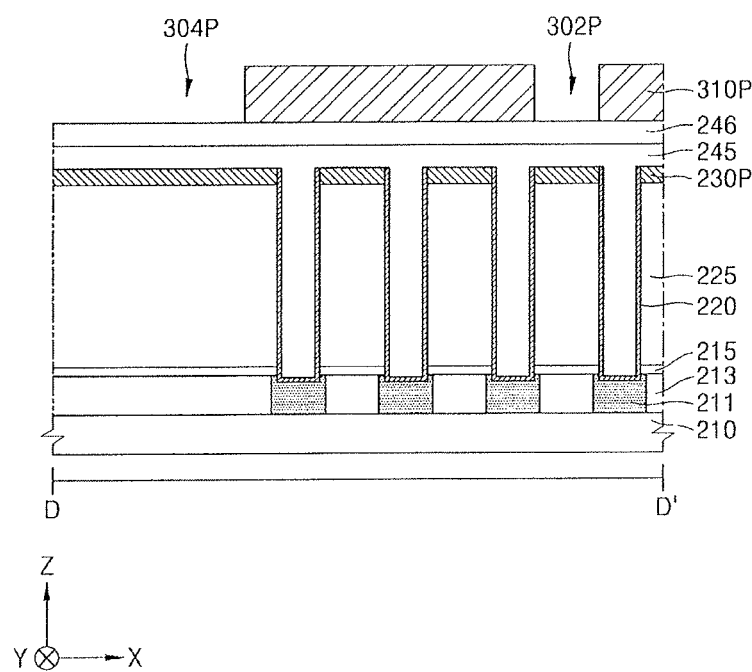

Referring to FIG. 11F, the second photoresist 310 (e.g., see FIG. 11D) is patterned by photolithography process. A first pattern 302P where an open region OP (e.g., see FIG. 11G) is to be formed and a second pattern 304P where a support pattern in the outer cell region 210P (e.g., see FIG. 6) is to be removed may therefore be defined.

The first pattern 302P may have a predetermined (e.g., circular) shape formed over some portions of each of three neighboring lower electrodes 220 and may be arranged in a first direction (X direction) and a second direction (Y direction), which are parallel to an upper surface of the semiconductor substrate 210, thereby forming a plurality of rows and columns. A first pattern 302P constituting any one row may be disposed in a staggered manner with a first pattern 302P constituting another row.

Design rules for the components of semiconductor devices may decrease as the degree of integration of semiconductor devices increases. In a highly integrated semiconductor device, due to technical limitations of a photolithography process, it may be very difficult to repeatedly form the first patterns 302P uniformly adjacent to each other on every lower electrode 220. By performing the photolithography process using the phase shift mask 100 (e.g., see FIG. 1) according to one or more embodiments, shapes such as the first pattern 302P may be repeatedly formed uniformly adjacent to each other.

Figure 11G:
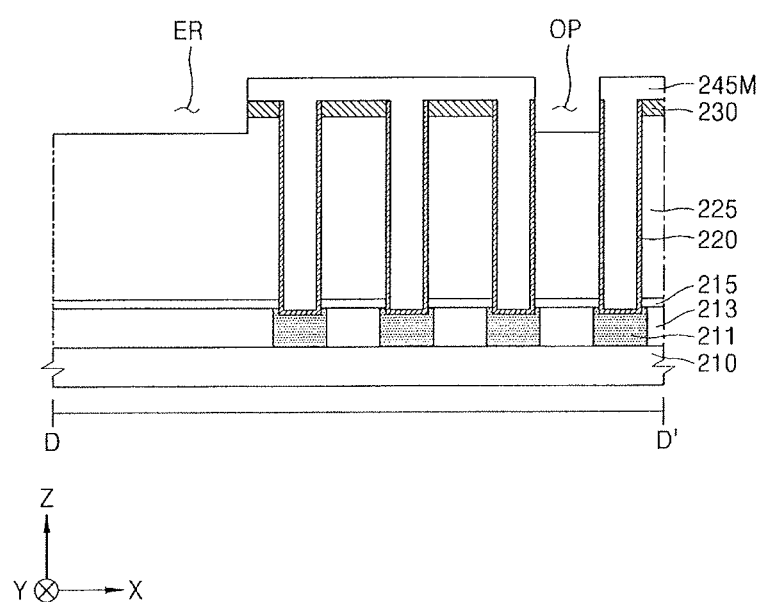

Referring to FIG. 11G, the third sacrificial film 245 is etched using the second photoresist pattern 310P as an etch mask to form a third sacrificial mask 245M. The support pattern 230P (e.g., see FIG. 11F) is etched using the third sacrificial mask 245M as an etch mask to form the support 230 including a removal region ER and the open region OP. After the etching process, the second photoresist pattern 310P is removed. In addition, when etching the support pattern 230P, some surfaces of the plurality of lower electrodes 220 may be exposed.

As described above, as the removal region ER and the open region OP are formed, a sufficient space through which a wet etching solution may penetrate may be formed in a subsequent wet etching process. In a semiconductor device according to one or more embodiments, the support 230 including the open region OP allows the wet etching solution to easily penetrate therethrough during a wet etching process. The support 230 also provides a diffusion path for a source gas and a reaction gas to form a dielectric film during a process for forming a dielectric film, as described below.

For example, in the semiconductor device 200 (e.g., see FIG. 6) according to one embodiment, all of the plurality of lower electrodes 220 are opened by the open region OP. Accordingly, the wet etching process may be smoothly performed and excellent step coverage of the dielectric film forming process may secured.

The open region OP is substantially secured when etching the support pattern 230P, which facilitates the subsequent process as described above while maintaining the support performance of the support 230. For example, if the open region OP is formed widely or in a number greater than the required number, support performance of the support 230 may be weakened. Otherwise, if the open region OP is formed narrowly or in a number less than the required number, problems in the subsequent wet etching process and the dielectric film forming process may occur.

Figure 11H:
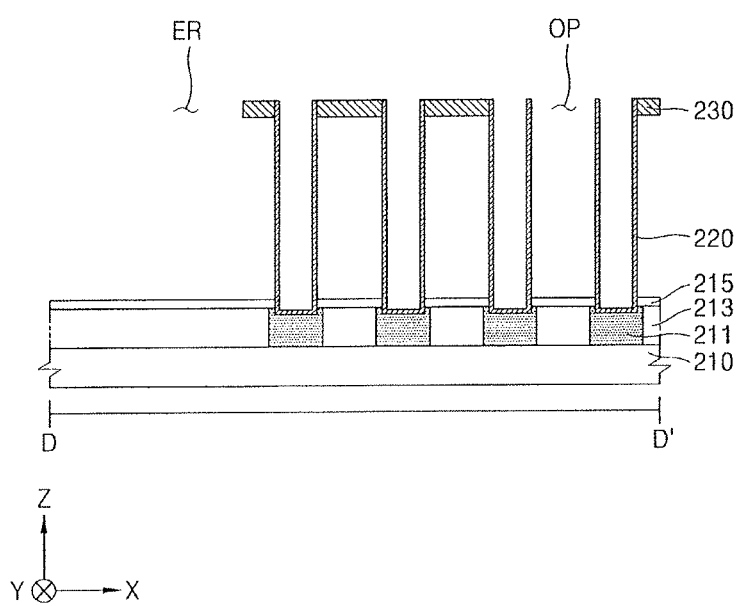

Referring to FIG. 11H, a third sacrificial mask 245M and the mold pattern 225 (e.g., see FIG. 11G) are completely removed by the wet etching process. The mold pattern 225 may include a silicon oxide film. In this case, the wet etching process may be performed using a wet etching solution such as a fluorinated acid or a buffered oxide etchant (BOE) solution. The wet etching solution penetrates through the removal region ER formed in the third sacrificial mask 245M and the open region OP formed in the support 230 to wet-etch the third sacrificial mask 245M and the mold pattern 225. For example, the third sacrificial mask 245M may also be concurrently removed during the wet etching of the mold pattern 225.

During the wet etching process, the support 230 may not be etched and may firmly fix and support the plurality of lower electrodes 220 so that they do not collapse or break. Also, the etching stopper pattern 215 may prevent the wet etching solution from penetrating below the plurality of lower electrodes 220. The support 230 may be formed to support the plurality of lower electrodes 220 by connecting them to each other and may be formed to include the plurality of open regions OP opening the plurality of lower electrodes 220.

Figure 11I:
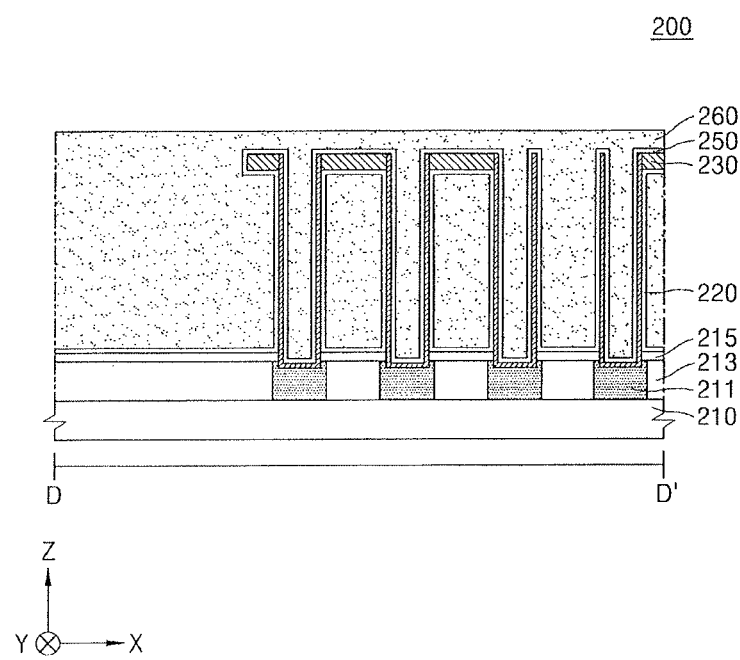

Referring to FIG. 11I, the dielectric film 250 is formed to conformally cover the plurality of lower electrodes 220 and the support 230, and the upper electrode 260 is formed on the entire surface of the dielectric film 250. A source gas and a reaction gas may be sufficiently supplied through the open region OP (e.g., see FIG. 11H) formed in the support 230 so that the dielectric film 250 and the upper electrode 260 may be smoothly and uniformly formed.

The dielectric film 250 may be conformally formed along a surface of the plurality of lower electrodes 220, a surface of the support 230, and an upper surface of the etching stopper pattern 215. The dielectric film 250 may include at least one selected from a silicon oxide film, a silicon nitride film, a silicon oxynitride film, or a high-k material film. The dielectric film 250 may be configured to separate the plurality of lower electrodes 220 and the upper electrode 260 formed in a subsequent process, so that the plurality of lower electrodes 220 and the upper electrode 260 may serve as capacitors.

The upper electrode 260 may entirely fill portions where the mold pattern 225 and the third sacrificial mask 245M (e.g., see FIG. 11G) are removed. A conductive material to be the upper electrode 260 may include any one of a metal nitride film, a metal film, or a combination thereof. For example, the conductive material may include at least one selected from TiN, Ru, TaN, WN, Pt and Ir. The conductive material may be formed by CVD or ALD.

According to one or more embodiments, the semiconductor device 200 is formed to include a capacitor using the aforementioned fabricating method. The capacitor may correspond to a memory cell array of the semiconductor device 200, such as a DRAM. The semiconductor device 200 may further include a switching array under the capacitor. The switching array may include switching transistors connected to each of the contact plugs 211.

According to one or more embodiments, the semiconductor device 200 may be fabricated, via the aforementioned process, using the phase shift mask 100, which is capable of improving distribution of the open region OP. The semiconductor device 200 includes the support 230, in which all of the lower electrodes 220 are open to smoothly perform the subsequent process. Thus, reliability of the semiconductor device 200 may be secured along with high productivity of the process.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device comprising:
   a plurality of lower electrodes arranged on a semiconductor substrate in a first direction and a second direction perpendicular to the first direction; and
   a support contacting the plurality of lower electrodes, the support being in a planar shape and having four edges, the support including a plurality of open regions for respectively opening portions of the plurality of lower electrodes,
   wherein, from among the four edges, two edges facing each other in the first direction are straight lines and two edges facing each other in the second direction are waveforms.

2. The semiconductor device of claim 1, wherein:
   the plurality of lower electrodes are arranged in a honeycomb structure,
   each of six lower electrodes among the plurality of lower electrodes is at a corresponding vertex of a hexagon and one of the plurality of lower electrodes is at a center point of the hexagon, the six lower electrodes among the plurality of lower electrodes and the one of the plurality of lower electrodes forming a hexagon structure, each of the six lower electrodes among the plurality of lower electrodes is at a corresponding center point of each of six different hexagon structures, and the one of the plurality of lower electrodes is one of the plurality of lower electrodes at a corresponding vertex of each of the six different hexagon structures, the six different hexagon structures sharing the one of the plurality of lower electrodes.

3. The semiconductor device of claim 1, wherein each of the waveforms of the two edges has a constant repetition period and the waveforms of the two edges have opposite phases.

4. The semiconductor device of claim 1, wherein each of the open regions exposes a portion of each of three neighboring lower electrodes among the plurality of lower electrodes.

5. The semiconductor device of claim 1, wherein the support is formed as an integral body, and lower electrodes among the plurality of lower electrodes formed in a periphery of the four edges are dummy structures.

6. The semiconductor device of claim 5, wherein the dummy structures are asymmetrically arranged in a periphery of two edges facing each other in the first direction.

7. The semiconductor device of claim 6, wherein the dummy structures do not contact the plurality of open regions.

8. The semiconductor device of claim 1, wherein a radius of curvature of each of the waveforms is greater than a radius of curvature of each of the open regions.

9. The semiconductor device of claim 8, wherein the radius of curvature of each of the open regions is greater than a radius of curvature of each of the plurality of lower electrodes.

10. The semiconductor device of claim 1, wherein a virtual line connecting centers of the plurality of lower electrodes arranged in the first direction is a straight line, and a virtual line connecting centers of the plurality of lower electrodes arranged in the second direction is a zigzag line.

11. A semiconductor device comprising:
a plurality of lower electrodes arranged on a semiconductor substrate in a first direction and a second direction perpendicular to the first direction; and
a support contacting the plurality of lower electrodes, the support being in a planar shape and having four edges, the support including a plurality of open regions for respectively opening portions of the plurality of lower electrodes,
wherein lower electrodes among the plurality of lower electrodes formed in a periphery of the four edges are dummy structures, and the dummy structures do not contact the plurality of open regions.

12. The semiconductor device of claim 11, wherein the dummy structures are asymmetrically arranged in a periphery of two edges facing each other in the first direction.

13. The semiconductor device of claim 12, wherein dummy structures arranged in a periphery of one of the two edges facing each other in the first direction are arranged in two rows in the second direction, and dummy structures arranged in a periphery of the other one of the two edges facing each other in the first direction are arranged in one row in the second direction.

14. The semiconductor device of claim 11, wherein, from among the four edges, two edges facing each other in the second direction are waveforms, and a radius of curvature of each of the waveforms is greater than a radius of curvature of each of the open regions.

15. The semiconductor device of claim 11, wherein, from among the four edges, two edges facing each other in the first direction are straight lines.

16. A semiconductor device comprising:
a semiconductor substrate;
an interlayer insulating layer disposed on the semiconductor substrate;
a plurality of contact plugs in the interlayer insulating layer;
a plurality of lower electrodes on the interlayer insulating layer, each of the plurality of lower electrodes disposed on a corresponding contact plug among the plurality of contact plugs in a first direction and a second direction perpendicular to the first direction; and
a support contacting the plurality of lower electrodes, the support being in a planar shape and having four edges, the support including a plurality of open regions for respectively opening portions of the plurality of lower electrodes,
wherein, from among the four edges, two edges facing each other in the first direction are straight lines and two edges facing each other in the second direction are waveforms, and lower electrodes among the plurality of lower electrodes formed in a periphery of the four edges are dummy structures and the dummy structures do not contact the plurality of open regions.

17. The semiconductor device of claim 16, further comprising:
a dielectric layer conformally covering the plurality of lower electrodes and the support through the plurality of open regions; and
an upper electrode arranged on an entire surface of the dielectric layer.

18. The semiconductor device of claim 17, wherein the plurality of lower electrodes, the dielectric layer, and the upper electrode function as a capacitor.

19. The semiconductor device of claim 16, wherein a radius of curvature of each of the waveforms is greater than a radius of curvature of each of the open regions, and the radius of curvature of each of the open regions is greater than a radius of curvature of each of the lower electrodes.

20. The semiconductor device of claim 16, wherein a material constituting the support comprises silicon nitride or polysilicon and the support has a thickness of about 20 nm to about 150 nm.

* * * * *